United States Patent
Sung

(10) Patent No.: US 7,144,820 B2
(45) Date of Patent: Dec. 5, 2006

(54) METHOD OF MANUFACTURING A LAYER SEQUENCE AND A METHOD OF MANUFACTURING AN INTEGRATED CIRCUIT

(75) Inventor: Kwon O. Sung, Hsinchu (TW)

(73) Assignee: Infineon Technologies AG, Munich (DE)

( * ) Notice: Subject to any disclaimer, the term of this patent is extended or adjusted under 35 U.S.C. 154(b) by 50 days.

(21) Appl. No.: 10/751,257

(22) Filed: Jan. 2, 2004

(65) Prior Publication Data

US 2005/0148189 A1 Jul. 7, 2005

(51) Int. Cl.
*H01L 21/302* (2006.01)
*B44C 1/22* (2006.01)

(52) U.S. Cl. ............. 438/719; 719/766; 719/924; 216/62; 216/79

(58) Field of Classification Search ........... 216/62; 438/924
See application file for complete search history.

(56) References Cited

U.S. PATENT DOCUMENTS

| | | | |
|---|---|---|---|
| 5,854,115 A * | 12/1998 | Gardner et al. | 438/305 |
| 6,168,998 B1 * | 1/2001 | Park | 438/283 |
| 6,261,885 B1 * | 7/2001 | Cheek et al. | 438/199 |
| 6,703,269 B1 * | 3/2004 | Brown et al. | 438/199 |
| 6,790,577 B1 | 9/2004 | Nakamura | |

FOREIGN PATENT DOCUMENTS

JP 00/02782 4/2000

OTHER PUBLICATIONS

Wolf, Silicon Processing for the VLSI Era, 2002, Lattice Press, vol. 4, pp. 244-245.*
Callister, Materials Science and Engineering, 1997, John Wiley & Sons, 4th ed., pp. 605-609.*

* cited by examiner

*Primary Examiner*—Shamim Ahmed
*Assistant Examiner*—Eric B. Chen
(74) *Attorney, Agent, or Firm*—Brinks Hofer Gilson & Lione

(57) ABSTRACT

A method of manufacturing a layer sequence having a first and a second laterally confined structure comprises the steps of providing a first layer on a first surface portion of a substrate, which first layer is doped with dopant of a first type of conductivity, providing a second layer on a second surface portion of the substrate, which second layer is free of dopant of the first type of conductivity, forming a third layer on the first layer, which third layer is free of dopant of the first type of conductivity, and forming a fourth layer on the second layer, which forth layer is doped with dopant of the first type of conductivity. The first layer and the third layer are etched, thereby patterning the first and third layer to form the first laterally confined structure. The second layer and the forth layer are etched, thereby patterning the second and fourth layer to form the second laterally confined structure.

15 Claims, 2 Drawing Sheets

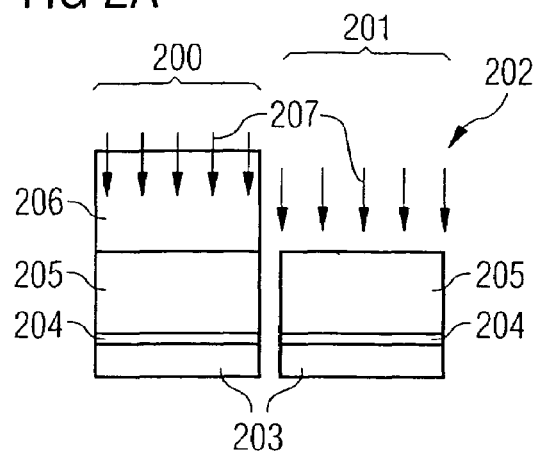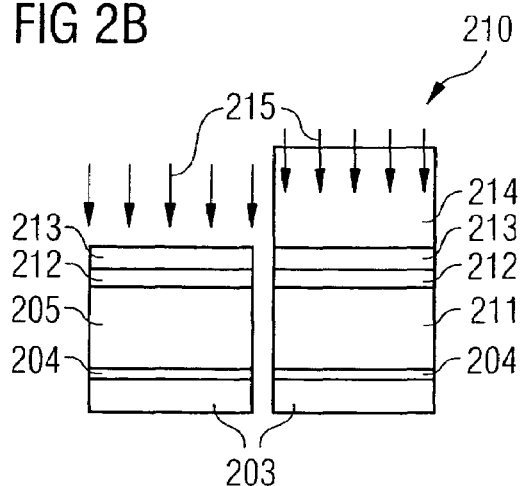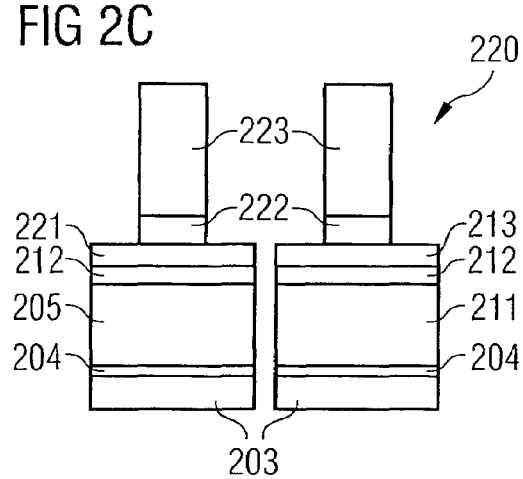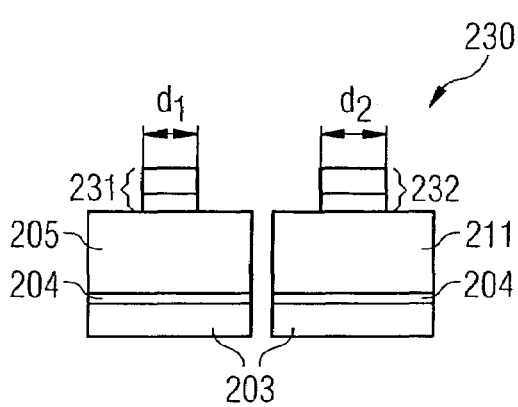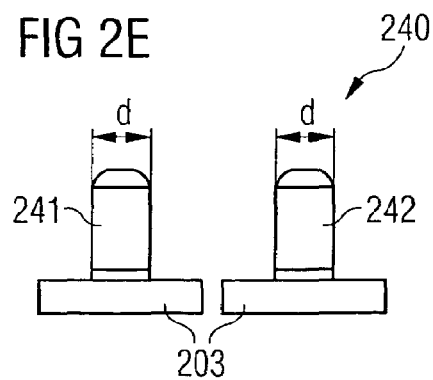

METHOD OF MANUFACTURING A LAYER SEQUENCE AND A METHOD OF MANUFACTURING AN INTEGRATED CIRCUIT

BACKGROUND OF THE INVENTION

1. Field of the Invention

The present invention relates to a method of manufacturing a layer sequence and to a method of manufacturing an integrated circuit.

2. Description of the Related Art

One of the big issues in gate patterning of logic devices for 90 nm technology lithography is the CD-difference in n-MOS and p-MOS transistors. CD, critical dimension, denotes the size of the smallest geometrical features (e.g. width of a gate stack) which can be manufactured during semiconductor manufacturing using a given technology.

When forming a gate stack for an n-MOS transistor on the one hand and for a p-MOS transistor on the other hand, the width of the gate stack usually differs between the two devices of a CMOS architecture due to an effect described in the following. Comparing undoped silicon and n-doped silicon, the chemical etching of silicon in halogen-based discharges is affected by the type and concentration of electrically active dopants. P-type doping (e.g. boron) suppresses silicon etch rate slightly (by as much as a factor of two), while high concentrations of n-typed dopants (e.g. arsenic or phosphorus) enhance etching by a factor of 1.5 to 2.

N-type doping raises the Fermi level and thereby reduces the energy barrier for charge transfer to chemisorbed chlorine.

Chlorine and/or bromine atoms, which may be used for etching a gate stack of an n-MOS or a p-MOS transistor, are covalently bound to specific sites of an undoped silicon surface. The formation of a more ionic silicon-halogen surface bond, due to the n-type sites and enhanced electron transfer, opens additional chemisorption sites and facilitates etchant penetration into the substrate lattice, which makes it possible for impinging chlorine atoms to more readily chemisorp, penetrate the lattice, and react.

When forming a CMOS device, n-MOS areas comprise a pre-implantation before being etched (e.g. phosphorus implantation), but in p-MOS areas, such a pre-implantation is not present. Consequently, when etching a gate stack for an n-MOS area and a p-MOS area, there is a difference in etch rate between n-MOS area and p-MOS area. An n-MOS area shows a higher etch rate than a p-MOS area, and finally smaller CD.

This results in different gate widths in n-MOS and p-MOS transistors yielding different electrical properties and transistor parameter values (e.g. threshold voltage) of p-MOS and n-MOS transistors in a CMOS device. Such differences are undesired, since they may deteriorate the performance of the transistor components of an integrated circuit.

In the following, the described shortcoming will be explained in more detail on the basis of FIG. 1A to FIG. 1E showing layer sequences according to a method of manufacturing a layer sequence for a CMOS device according to the prior art.

Referring to FIG. 1A to FIG. 1E, on the left hand of each of the figures, there are shown p-MOS layer sequences 100, and n-MOS layer sequences 101 are shown on the right hand side, respectively. Layer sequences 100, 101 are formed on different surface regions of the same substrate.

Layer sequence 102 shown in FIG. 1A is obtained by depositing a gate oxide layer 104 on a silicon substrate 103. Subsequently, an undoped polysilicon layer 105 is deposited on the gate oxide layer 104. Further, a photoresist layer 106 is applied to the surface of the n-MOS layer sequence 100 and of the n-MOS layer sequence 101. Subsequently, a lithography process is carried out to maintain material of the photoresist 106 only on top of the p-MOS layer sequence 100, whereas the surface of the undoped polysilicon layer 105 is free of photoresist 106 and thus exposed in the n-MOS layer sequence 101. After that, an n-type implantation 107 process is carried out implanting phosphorus material only in the undoped polysilicon layer 105 in the n-MOS layer sequence 101, whereas the photoresist 106 covering the undoped polysilicon layer 105 on the p-MOS layer sequence 100 prevents n-type dopant from being introduced in undoped polysilicon layer 105 of p-MOS layer sequence 100.

Layer sequence 110 as shown in FIG. 1B is obtained by removing photoresist 106 from the surface of layer sequence 102.

As a result of the implantation process just described, an n-doped polysilicon layer 111 is generated due to the exposure of undoped polysilicon layer 105 of the n-MOS layer sequence 101 during the implantation process. In contrast to this, the undoped polysilicon layer 105 is maintained in the CMOS layer sequence 100. FIG. 1B shows the doped polysilicon layer 111 in the n-MOS area 101 after the described gate implantation.

After having doped polysilicon layer 111 by implantation and after having removed photoresist 106, a hard mask 112 is formed by depositing silicon oxide material which is later used as an etch barrier. The thickness of the hard mask 112 is typically 500Å to 2000Å, and generally TEOS ("tetra ethyl ortho silicate") is used as the silicon oxide material.

To obtain the layer sequence 120 shown in FIG. 1C, both areas 100, 101 are covered with a BARC-layer which is subsequently covered by a further photoresist layer. BARC means "bottom antireflective coating". A BARC structure is used in photolithography to enhance the control of critical dimension (CD) by suppressing reflective notching, standing wave effects and the swing ratio caused by thin film interference. BARC-layer and further photoresist layer are then patterned using a lithography and an etching process to form laterally confined structures on both areas 100, 101 consisting of BARC structure 121 and photoresist structure 122.

To obtain the layer structure 130 shown in FIG. 1D, the hard mask 112 is etched on the p-MOS layer sequence 100 and on the n-MOS layer sequence 101 using the laterally confined stack of BARC structure 121 and the photoresist structure 122 as an etching mask. This results in hard mask structures 131 which are laterally confined structures on the surface of undoped polysilicon layer 105 on the one hand and on the surface of n-doped polysilicon layer 111 on the other hand. The BARC structure 121 and the photoresist structure 122 are then removed. The lateral width of the hard mask structures 131, d, is almost equal at the p-MOS layer sequence 100 and at the n-MOS layer sequence 101, since the etching rate when etching structures 112 does not differ between the p-MOS layer sequence 100 and the n-MOS layer sequence 101, due to the identical material of hard mask 112 on both areas 100, 101. In other words, after etching the hard mask 112, CD of p-MOS and n-MOS are almost the same, i.e. the length d is approximately equal in region 100 and in region 101.

To obtain the CMOS gate stack layer sequence 140 shown in FIG. 1E, a polysilicon-selective etching process is carried out. Due to the above-described effect that the etching rate is larger for the n-doped polysilicon layer 111 due to the introduced phosphorus dopant than the etching rate of the undoped polysilicon layer 105, the width $d_2$ of the n-doped gate 142 at the n-MOS layer sequence 101 is substantially smaller than the width $d_1$ of the undoped gate 141 of the p-MOS layer sequence 100. This is a result of the higher etch rate of the n-doped polysilicon 111 in the n-MOS area 101 as compared to the undoped (or only intrinsic doped) polysilicon 105 in the p-MOS area 100.

Thus, the p-MOS transistor shown on the left hand of FIG. 1E performs different electrical properties (threshold voltage, etc.) than the n-MOS transistor on the right hand side of FIG. 1E.

The problem of different gate stack length as described above particularly appears in 90 nm logic technology using a high energy pre-implantation scheme. Until the 130 nm technology, this problem has not been that severe.

According to the state of the art, the different widths of p-MOS and n-MOS transistors are tried to be made approximately equal by adjusting lithography CD by OPC ("optical proximity correction"). OPC is a correcting process for compensating mask errors. In other words, OPC is a means of addressing lithography distortions in semiconductor manufacturing. The goal of OPC is to produce smaller features in using a given equipment set by enhancing the printability of a waver pattern. OPC applies systematic changes to photomask geometries to compensate for non-linear distortions caused by optical diffraction and resist process effects. A mask incorporating OPC is thus a system that negates undesirable distortion effects using pattern transfer.

However, the OPC method is very expensive and difficult and substantially increases the processing time for manufacturing an integrated circuit.

SUMMARY OF THE INVENTION

It is an object of the present invention to provide a simplified method of manufacturing a layer sequence having laterally confined structures of essentially the same width when processing materials having different dopant properties.

This object is achieved by providing a method of manufacturing a layer sequence having a first and a second laterally confined structure, the method comprising the steps of providing a first layer on a first surface portion of a substrate, which first layer is doped with dopant of a first type of conductivity. Further, a second layer is provided on a second surface portion of the substrate, which second layer is free of dopant of the first type of conductivity. A third layer is formed on the first layer, which third layer is free of dopant of the first type of conductivity. Further, a fourth layer is formed on the second layer, which fourth layer is doped with dopant of the first type of conductivity. The first layer and the third layer are etched, thereby patterning the first and third layer to form the first laterally confined structure. Moreover, the second layer and the fourth layer are etched, thereby patterning the second and fourth layer to form the second laterally confined structure.

Beyond this, the object of the invention is achieved by a method of manufacturing an integrated circuit, comprising manufacturing a plurality of layer sequences with the above-mentioned method steps in and/or on the substrate.

The above and other objects, features and advantages of the present invention will become apparent from the following description and the appended claims, taken in conjunction with the accompanying drawings, in which like parts or elements are denoted by like reference numbers.

A basic idea of the invention is to compensate the effect of different etching rates of material comprising a dopant compared to material which is free of the dopant, by applying on a layer to be etched which comprises the dopant an auxiliary layer which is free of the dopant, and by correspondingly covering a layer to be etched which is free of the dopant by another auxiliary layer comprising the dopant. Thus, a first layer structure comprising a layer having the dopant on an layer free of the dopant is provided, and a second layer structure comprises a layer free of the dopant on a layer having the dopant. Subsequently, the layer sequence of the dopant comprising a layer under the dopant free auxiliary layer on the one hand, and the dopant free layer under the dopant comprising auxiliary layer on the other hand are etched simultaneously. In both of the layer sequences, the etching rate of one of the two sub-layers is high and the other etching rate is low due to the different dopant properties. Thus, the mean mutual etching rate of first layer and first auxiliary layer on the one hand, and of second layer and second auxiliary layer on the other hand is essentially the same. Thus, laterally confined structures obtained from etching the two layer sequences have essentially the same width.

Applying the idea to a CMOS-device, a gate patterning method is provided realizing n-MOS and p-MOS transistors with the same gate width, and thus an integrated circuit with improved properties, since differing electrical properties between n-MOS and p-MOS field effect transistors resulting from different gate widths are eliminated or at least significantly reduced according to the invention.

In other words, the problem that the gate stack etching in a CMOS device yields different gate widths in a p-MOS transistor and an n-MOS transistor due to the different etching rate of n-doped and p-doped (or undoped) silicon material is solved by depositing an n-type semiconducting layer above a p-type semiconducting gate layer, and a p-type semiconducting layer above an n-type semiconducting gate layer. Etching both layer sequences, the effects of different etching rates compensate each other, so that the gate widths are essentially identical. As a consequence, the electrical properties of the resulting transistors are more similar for the two transistor types than according to the state of the art.

Alternatively to depositing an n-type semiconducting layer above a p-type semiconducting gate layer, and a p-type semiconducting layer above an n-type semiconducting gate layer, an n-type semiconducting layer may be deposited above an undoped semiconducting gate layer, and an undoped semiconducting layer may be deposited above an n-type semiconducting gate layer. Further alternatively, a p-type semiconducting layer may be deposited above an undoped semiconducting gate layer, and an undoped semiconducting layer may be deposited above a p-type semiconducting gate layer.

Advantageously, the method of the invention is very simple, does not involve additional masks and maintains a short processing time, so that the structures can be produced with little effort.

Preferably, to minimize the CD reduction, an additional polysilicon layer is deposited on the top of a hard mask oxide layer, and the p-MOS area is implanted with similar implantation conditions as it is done in the n-MOS area. The implantation energy and dose could be adjusted. Then in the following, gate hard mask patterning (hard mask oxide/polysilicon) process is carried out, the p-MOS area becomes smaller post hard mask CD than n-MOS due to the implantation effect in the p-MOS area. Thus, finally after gate polysilicon patterning, CD reduction n-MOS area and CD difference between the n-MOS area and the p-MOS area is compensated by smaller post hard mask CD in p-MOS area.

The invention preferably uses another thin polysilicon layer on the top of a hard mask oxide and implantation to reduce post hard mask etching CD in p-MOS area. This reduced hard mask CD in p-MOS area contribute in reducing CD difference between n-MOS and p-MOS after polysilicon gate etching.

Undoped in the meaning of the invention means that the corresponding material is free of externally introduced dopant. However, such undoped material may be intrinsically doped. For example, silicon substrates may comprise intrinsic doping of the p-type. However, the term undoped material also covers material which is fully-depleted of charge carriers.

Moreover, another aspect of the invention can be seen in combining the processing parameters "thickness of the layers to be etched" and "concentration of dopant" in this layer. The time required for etching a layer depends on both, thickness and dopant concentration of a layer. The idea of the invention to compensate different etching rates of layers having different dopant properties by applying an auxiliary layer having etching properties for compensating low/fast etch rate of the layer below, can be realized by taking into account both auxiliary layer thickness and dopant concentration. For instance, when doping an auxiliary layer arranged above a layer below, it might be advantageously to use a relatively low implantation rate to avoid dopant atoms to be introduced in the layer below. However, in order to adjust properly the time needed for etching the auxiliary layer, its thickness may be used as adjustment parameter. By taking this measure, the processing architecture may be further optimised, and the degree of flexibility is increased.

In the following, preferred embodiments of the invention are described.

According to the method of manufacturing a layer sequence of the invention, the second layer and the third layer may be doped with dopant of a second type of conductivity differing from the first type of conductivity.

The first type of conductivity can be n-type conductivity, and the second type of conductivity can be p-type conductivity, or vice versa.

Patterning may be carried out such that the width of the first laterally confined structure generally equals the width of the second laterally confined structure. In doing so, the electrical properties of the electronic members related to the two laterally confined structures are quite similar.

The patterning may include, besides the etching, a lithography process. Particularly, gas etching methods are preferred for the invention (plasma etching), and the material to be etched is preferably polysilicon. The etching process is preferably an isotopic etching process, such that etching is carried out in both vertical and horizontal directions of the layer sequence. The etching may be carried out by using an etching gas. Preferably, the etching is a plasma etching process, e.g. using chlorine or fluorine.

As the substrate, a semiconductor substrate, preferably a silicon substrate, may be provided. Alternatively, a silicon oxide or another insulator substrate may be provided, a germanium substrate or a III-V-semiconductor material.

Further, an intermediate layer may be formed between the first layer and the third layer and may be formed between the second layer and the fourth layer, the intermediate layer serving as an etch stop layer, when etching the third layer and the fourth layer and/or serving as a mask when etching the first layer and the second layer. By providing the additional intermediate layer between the first layer and the third layer on the one hand or the second layer and the fourth layer on the other hand, a first etching can be performed with the layers above the stop layers, and then a second etching can be carried out to remove the intermediate layers, with the layers which had been arranged below the stop layers.

At least one of the first to fourth layers may be made from polysilicon.

A gate oxide layer may be formed between the substrate on the one hand and the first layer and the second layer on the other hand. By such a gate oxide layer, an electrical insulation is provided between a gate region above the gate oxide layer and a channel region below the gate oxide layer, when forming field effect transistors.

The patterned third and fourth layers are preferably removed from the layer structure.

According to a preferred embodiment, the first and second laterally confined structures are manufactured to be first and second field effect transistors (MOS-FET), the patterned first and second layers being the gate regions of the field effect transistors.

In doing so, a CMOS device may be formed with p-MOS and n-MOS field effect transistors having approximately equal gate widths.

In the following, preferred embodiments of the method of manufacturing an integrated circuit including the steps of the method of manufacturing a layer sequence are described. Preferred embodiments of the method of manufacturing a layer sequence are also valid for the method of manufacturing an integrated circuit, and vice versa.

The integrated circuit to be manufactured may be a CMOS circuit.

The integrated circuit to be manufactured may be a logic circuit. Alternatively, the integrated circuit manufactured may be a memory cell circuit, e.g. a DRAM ("dynamic random access memory") or an EEPROM ("electrically erasable and programmable read only memory").

BRIEF DESCRIPTION OF THE DRAWINGS

The accompanying drawings, which are included to provide a further understanding of the invention and constitute a part of the specification, illustrate embodiments of the invention.

In the drawings:

FIGS. 2A to 2E show layer sequences of a method of manufacturing a CMOS device according to a preferred embodiment of the invention.

DETAILED DESCRIPTION OF PREFERRED EMBODIMENTS OF THE INVENTION

Figure 1A:
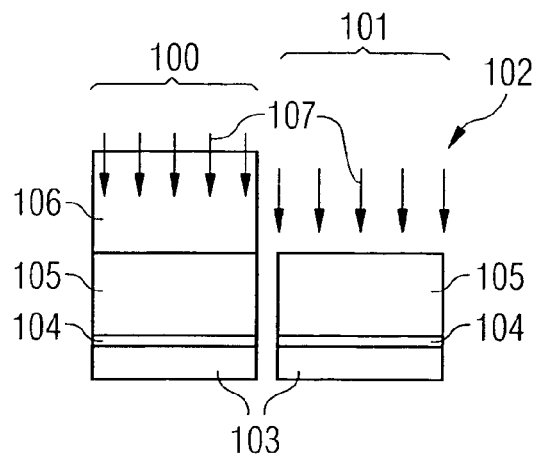
FIGS. 1A to 1E show different layer sequences of a method of manufacturing a CMOS device according to the prior art.
Figure 1B:
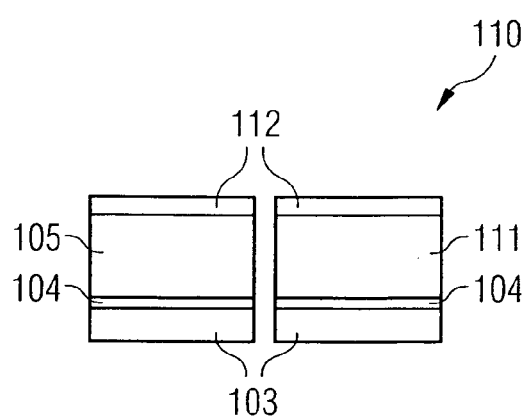
Figure 1C:
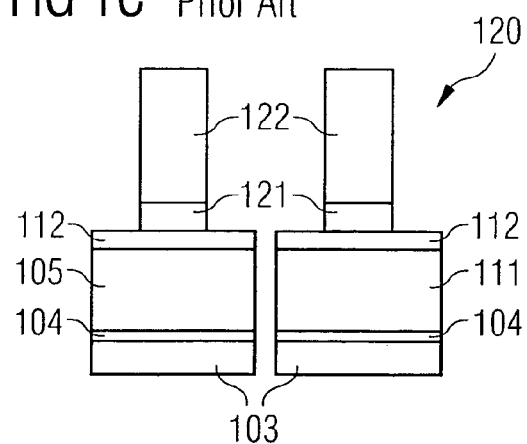
Figure 1D:
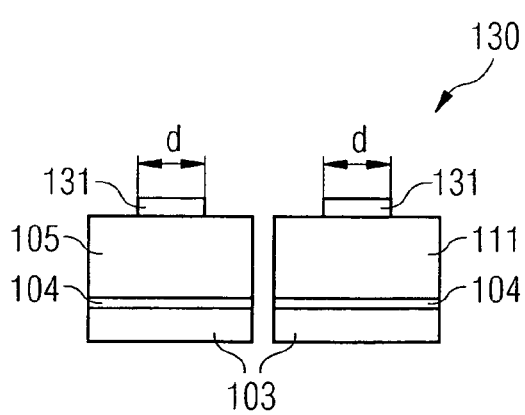
Figure 1E:
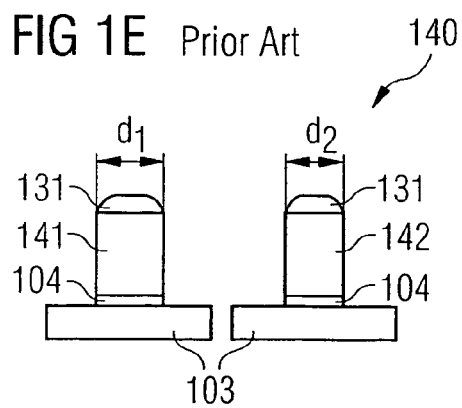

In the following, on the basis of FIG. 2A to FIG. 2E, it will be described a process of manufacturing a CMOS device comprising a p-MOS transistor and an n-MOS transistor on a single silicon substrate. A main goal of this new preferred method of manufacturing the p-MOS transistor and the n-MOS transistor is that the gate width of both transistors should be essentially equal, although an etching process for etching a gate stack is used which yields different etching rates for materials having different doping properties.

Each of FIG. 2A to FIG. 2E shows a p-MOS layer sequence 200 comprising layer sequences for forming a p-MOS field effect transistor, and an n-MOS layer sequence 201 comprising layer sequences for forming an n-MOS field effect transistor. The p-MOS layer sequences 200 are shown on the left hand of each of FIG. 2A to FIG. 2E, whereas the n-MOS layer sequences 201 are shown on the right hand of each of FIG. 2A to FIG. 2E.

Both, the p-MOS layer sequences 200 and the n-MOS layer sequence 201 are formed on different portions of the same substrate.

To obtain layer sequence 202 shown in FIG. 2A, a gate oxide layer 204 is deposited on a silicon substrate 203. After depositing silicon oxide material for forming gate oxide layer 204 on the silicon substrate 203, an undoped polysilicon layer 205 is deposited on top of the gate oxide layer 204. After the deposition of the gate oxide layer 204 and the undoped polysilicon layer 205, the p-MOS area 200 is covered with photoresist 206 for the following implantation process. A photoresist layer is uniformly applied on the surface of the undoped polysilicon layers 205 in both regions 200, 201. After that, using a lithography and an etching process, the photoresist is removed from the n-MOS layer sequence 201, whereas photoresist 206 is maintained on the top of the p-MOS layer sequence 200. After that, an n-type implantation method is carried out implanting phosphorus material only in the polysilicon layer 205 in area 201, whereas no phosphorus material is implanted in polysilicon layer 205 in area 200 due to the coverage with photoresist 206. During the implantation process, phosphorous atoms are used for gate polysilicon implantation with energy of 15 keV to 30 keV and a dose of between $1\ 10^{15}\ cm^{-2}$ and $10\ 10^{15}\ cm^{-2}$. As a consequence of the doping process, undoped polysilicon layer 205 is converted into n-doped polysilicon layer 211 in area 201, as shown in FIG. 2B.

To obtain layer sequence 210 shown in FIG. 2B, the photoresist 206 is removed from p-MOS layer sequences 200, e.g. by stripping. Subsequently, a hard mask 212 is applied on the surface of the undoped polysilicon layer 205 and the n-doped polysilicon layer 211. The hard mask 212 later serves as an etch barrier. The hard mask 212 is made of silicon oxide material, preferably TEOS material ("tetra ethyl ortho silicate"), and is provided with a thickness of usually between 500Å and 2000 Å.

Subsequently, an auxiliary undoped polysilicon layer 213 is deposited onto the hard mask 212, on both the p-MOS layer sequence 200 and the n-MOS layer sequence 201. After that, another photoresist layer 214 is applied on the auxiliary undoped polysilicon layer 213 on both layer sequences 200, 201. Photoresist layer 214 is subsequently removed selectively only from p-MOS layer sequence 200 using a lithography and an etching process. Thus, material of the photoresist 214 only remains on the layer structure 201 as an implantation mask for further processing.

As further shown in FIG. 2B, another n-type implantation 215 using phosphorus atoms is carried out. As a result of this additional n-type implantation 215, the auxiliary undoped polysilicon layer 213 being exposed to the phosphorus material in p-MOS layer sequence 200 is converted into auxiliary n-doped polysilicon layer 221, as shown in FIG. 2C. Due to the fact that auxiliary undoped polysilicon layer 213 in area 201 is covered during the n-type implantation 215 by photoresist 214, the auxiliary undoped polysilicon layer 213 remains undoped in the p-MOS layer sequence 201.

In other words, the n-MOS area 201 is covered by photoresist 214 for phosphorus implantation 215 through a lithography process. Phosphorus implantation is very important for the result of the invention to be achieved. Its energy should be controlled such as not to penetrate under the oxide layer 212 seriously, and the amount of dose is similar to the amount of dose used in gate polysilicon implantation shown in FIG. 2A. Thus, the dose is between about $1\ 10^{15}\ cm^{-2}$ and $10\ 10^{15}\ cm^{-2}$. Overall its energy and dose should be controlled to get enough CD reduction in the following hard mask 212 etching.

To obtain the layer sequences 220 shown in FIG. 2C, photoresist 214 is removed from n-MOS layer sequence 201. Subsequently, a BARC-layer ("bottom antireflective coating") and a further photoresist layer are applied on both p-MOS layer sequence 200 and n-MOS layer sequence 201. Subsequently, by using a lithography and an etching process, BARC-layer and further photoresist layer are etched to form a stack of BARC structure 222 and photoresist structure 223, as shown in FIG. 2C.

According to the layer sequence 220 of FIG. 2C, in p-MOS area 200, gate polysilicon 205 is free of n-dopant and auxiliary n-doped polysilicon layer 221 is n-doped. However, on n-MOS layer sequence 201, auxiliary undoped polysilicon layer 213 is free of n-dopant and gate polysilicon layer 211 is n-doped. This doping scheme is essential for a main effect of the invention, which can be understood from the etching processes described in the following, resulting in gate widths for p-MOS and n-MOS transistors which are approximately equal.

To obtain layer sequence 230 as shown in FIG. 2D, the sequence of the BARC structure 222 and the photoresist structure 223 in both areas 200, 201 are used as an etch mask for the plasma etching layers 221 and 212 in area 200, and for the plasma etching layers 213, 212 in area 201. After the plasma etching, the BARC structure 222 and the photoresist structure 223 are removed from both areas 200, 201. As seen in FIG. 2D, due to the different doping properties of the layer 221 and the layer 213, the width, $d_1$, of the laterally confined structure of area 200, is smaller than the width, $d_2$, of the laterally confined structure in area 201. After the etching process, a first laterally confined etching stack 231 is formed from the patterned layers 212, 221 in area 200, and a second laterally confined etching stack 232 is formed from the patterned layers 212, 213 in area 201.

The different widths $d_1$ and $d_2$ result from the effect described in detail above, i.e. the fast plasma etch rate of n-doped polysilicon 221 in the p-MOS layer sequence 200 compared to a slower etching rate of undoped polysilicon 213. Thus, $d_2 > d_1$.

To obtain CMOS gate stack layer sequence 240 shown in FIG. 2E, first and second laterally confined etching stacks 231, 232 are used as etching masks for subsequent plasma etching of undoped polysilicon layer 205 on p-MOS layer sequence 200, and for plasma etching of n-doped polysilicon layer 211 on n-MOS layer sequence 201. However, due to the different plasma etching rates of the undoped polysilicon layer 205 on the one hand and the n-doped polysilicon layer 211 on the other hand, the width d of the gates 241, 242 generated by the etching process are generally equal. As a consequence of the etching process, the undoped polysilicon layer 205 is converted in an undoped gate 241 and the n-doped polysilicon layer 211 is converted into n-doped gate 242. CMOS gate stack layer sequence 240 comprises a p-MOS transistor shown in p-MOS layer sequence 200 and an n-MOS transistor shown in n-MOS layer sequence 201 having same gate widths and therefore similar transistor parameters, i.e. threshold voltage.

Although not shown in the figures, an implantation process for forming source and drain regions is subsequently carried out by using the gates 241, 242 as implantation masks. Thus, in the silicon substrate 203, source and drain regions are formed and the transistors are subsequently completed by forming electrical connections for applying electric signals to and receiving electrical signals from the gate, the source and the drain.

What is claimed is:

1. A method of manufacturing a layer sequence having a first and a second laterally confined structure, comprising the steps of:
    providing a first layer on a first surface portion of a substrate, which first layer is doped with dopant of a first type of conductivity;
    providing a second layer on a second surface portion of the substrate, which second layer is free of dopant of the first type of conductivity;
    forming a third layer on the first layer, which third layer is free of dopant of the first type of conductivity;
    forming a fourth layer on the second layer, which forth layer is doped with dopant of the first type of conductivity;
    etching the first layer and the third layer, thereby patterning the first and third layer to form the first laterally confined structure; and
    etching the second layer and the forth layer, thereby patterning the second and fourth layer to form the second laterally confined structure.

2. The method of manufacturing a layer sequence according to claim 1, wherein the second layer and the third layer are doped with dopant of a second type of conductivity differing from the first type of conductivity.

3. The method of manufacturing a layer sequence according to claim 2, wherein one of the first and second types of conductivity is n-type conductivity and the other one of the first and second types of conductivity is p-type conductivity.

4. The method of manufacturing a layer sequence according to any of claims 1, wherein patterning is carried out such that the width of the first laterally confined structure generally equals the width of the second laterally confined structure.

5. The method of manufacturing a layer sequence according to claim 4, wherein the patterning includes the etching and a lithography process.

6. The method of manufacturing a layer sequence according to claim 5, wherein the etching is carried out using an etching gas.

7. The method of manufacturing a layer sequence according to claim 6, wherein the etching is a plasma etching.

8. The method of manufacturing a layer sequence according to claim 1, wherein a silicon substrate is provided as the substrate.

9. The method of manufacturing a layer sequence according to claim 1, wherein an intermediate layer is formed between the first layer and the third layer, the intermediate layer serving as an etch stop layer when etching the third layer and serving as a mask when etching the first layer.

10. The method of manufacturing a layer sequence according to claim 1, the intermediate layer is formed between the second layer and the forth layer, the intermediate layer serving as an etch stop layer when etching the forth layer and serving as a mask when etching the second layer.

11. A method of manufacturing a layer sequence having a first and a second laterally confined structure, comprising the steps of:
    providing a gate oxide layer on a substrate;
    providing a polysilicon layer having an undoped portion to form a gate of a p-MOS transistor and a n-doped portion to form a gate of an n-MOS transistor;
    providing a n-doped polysilicon layer over said undoped portion of said polysilicon layer; and providing an undoped polysilicon layer over said n-doped portion of said polysilicon layer.

12. The method of claim 11 further comprising a step of providing a hard mask layer over said polysilicon layer.

13. The method of claim 11 further comprising a step of providing a bottom antireflective coating over said n-doped polysilicon layer and said undoped polysilicon layer.

14. The method of claim 11 wherein said step of providing said n-doped polysilicon layer over said undoped portion of said polysilicon layer comprises doping said polysilicon layer over said undoped portion with approximately equal doping to said n-doped portion of said polysilicon layer.

15. The method of claim 11 further comprising a step of etching said gate of said p-MOS transistor and said gate of said n-MOS transistor to have approximately equal dimensions.

* * * * *